United States Patent [19]

Miller

[11] 4,140,944

[45] Feb. 20, 1979

[54] METHOD AND APPARATUS FOR OPEN DRAIN ADDRESSING OF A GAS DISCHARGE DISPLAY/MEMORY PANEL

[75] Inventor: John W. V. Miller, Toledo, Ohio

[73] Assignee: Owens-Illinois, Inc., Toledo, Ohio

[21] Appl. No.: 791,237

[22] Filed: Apr. 27, 1977

[51] Int. Cl.² .................... H05B 37/00; H05B 39/00; H05B 41/00

[52] U.S. Cl. .................................. 340/777; 340/805; 315/169.4

[58] Field of Search ................. 315/169 R, 169 TV; 340/324 M

[56] References Cited

U.S. PATENT DOCUMENTS

| | | | |
|---|---|---|---|
| 3,908,151 | 9/1975 | Schermerhorn | 315/169 TV |
| 3,993,990 | 11/1976 | Miller et al. | 315/169 TV X |
| 4,027,196 | 5/1977 | Criscimagna et al. | 315/169 TV |
| 4,063,131 | 12/1977 | Miller | 315/169 TV |

Primary Examiner—Alfred E. Smith
Assistant Examiner—Robert E. Wise
Attorney, Agent, or Firm—Myron E. Click; David H. Wilson

[57] ABSTRACT

A method and apparatus for operating a gas discharge display/memory panel having a pair of opposed electrode arrays. A pulsating potential sustainer wave form is applied to one electrode array while the other electrode array is maintained at the reference potential of the sustainer wave form, typically the system ground potential. The potentials are applied to the electrodes through switching circuits individual to the electrodes, each circuit including a normally turned on MOSFET and a feed through diode. The MOSFET and the diode are oppositely poled and connected in parallel between the potential sources and the associated electrode. When a cell is addressed, either written or erased, the MOSFETs in the switching circuits connected to the one electrode array are turned off except for the MOSFET connected to the electrode of the selected cell and the MOSFET in the switching circuit for the other electrode array connected to the electrode of the selected cell is turned off while an address pulser for each electrode array is turned on to apply partial select address voltage pulses to the selected cell. During this addressing, the electrodes of the one electrode array are clamped at a predetermined potential and the selected electrode of the other array can have a keyer pulse voltage applied thereto to improve the addressing of the cell.

13 Claims, 3 Drawing Figures

METHOD AND APPARATUS FOR OPEN DRAIN ADDRESSING OF A GAS DISCHARGE DISPLAY/MEMORY PANEL

BACKGROUND OF THE INVENTION

1. Field of the Invention

This invention relates to circuits for controlling gas discharge devices, especially multiple gas discharge display/memory devices which have an electrical memory and which are capable of producing a visual display or representation of data.

2. Description of the Prior Art

Heretofore, multiple gas discharge display and/or memory panels have been proposed in the form of a pair of dielectric charge storage members which are backed by electrodes, the electrodes being so formed and oriented with respect to an ionizable gaseous medium as to define a plurality of discrete gas discharge units or cells. The cells have been defined by a surrounding or confining physical structure such as the walls of apertures in a perforated glass plate sandwiched between glass surfaces and they have been defined in an open space between glass or other dielectric backed with conductive electrode surfaces by appropriate choices of the gaseous medium, its pressure and the electrode geometry. In either structure, charges (electrons and ions) produced upon ionization of the gas volume of a selected discharge cell, when proper alternating operating voltages are applied between the opposed electrodes, are collected upon the surface of the dielectric at specifically defined locations. These charges constitute an electrical field opposing the electrical field which created them so as to reduce the voltage and terminate the discharge for the remainder of the cycle portion during which the discharge producing polarity remains applied. These collected charges aid an applied voltage of the polarity opposite that which created them in the initiation of a discharge by imposing a total voltage across the gas sufficient to again initiate a discharge and a collection of charges. This repetitive and alternating charge collection and ionization discharge constitutes an electrical memory.

An example of a panel structure containing non-physically ioslated or open discharge cells is disclosed in U.S. Pat. No. 3,499,167 issued to Theodore C. Baker, et al. Physically isolated cells have been disclosed in the article by D. L. Bitzer and H. G. Slottow entitled "The Plasma Display Panel - A Digitally Addressable Display With Inherent Memory" Proceeding of the Fall Joint Computer Conference, I E E E, San Francisco, Cal., November 1966, pp 541-557 and in U.S. Pat. No. 3,559,190.

In the operation of the display/memory device an alternating voltage is applied, typically, by applying a first periodic voltage wave form to one array and applying a cooperating second wave form, frequently identical to and shifted on the time axis with respect to the first wave form, to the opposed array to impose a voltage across the cells formed by the opposed arrays of electrodes which is the algebraic sum of the first and second wave forms. The cells have a voltage at which a discharge is initiated. That voltage can be derived from an externally applied voltage or a combination of wall charge potential and an externally applied voltage. Ordinarily, the entire cell array is excited by an alternating voltage which, by itself, is of insufficient magnitude to ignite gas discharges in any of the elements. When the walls are appropriately charged, as by means of a previous discharge, the voltage applied across the element will be augmented, and a new discharge will be ignited. Electrons and ions again flow to the dielectric walls extinguishing the discharge. However, on the following half cycle, their resultant wall charges again augment the applied external voltage and cause a discharge in the opposite direction. The sequence of electrical discharges is sustained by an alternating voltage signal that, by itself, could not initiate that sequence.

In addition to the sustaining voltage, there are manipulating voltages or addressing voltages imposed on the opposed electrodes of a selected cell or cells to alter the state of those cells selectively. One such voltage, termed a "writing voltage" transfers a cell or discharge site from the quiescent to the discharging state by virtue of a total applied voltage across the cell sufficient to make it possible that on subsequent sustaining voltage half cycles the cell will be in the "on state". A cell in the "on state" can be manipulated by an addressing voltage, termed an "erase voltage", which transfers it to the "off state" by imposing sufficient voltage to draw off the surface or wall charges on the cell walls and cause them to discharge without being collected on the opposite cell walls in an amount such that succeeding sustainer voltage transistions are not augmented sufficiently by wall charges to ignite discharges.

A common method of producing writing voltages is to superimpose voltage pulses on a sustainer wave form in an aiding direction and cumulatively with the sustainer voltage, the combination having a potential of enough magnitude to fire an "off state" cell into the "on state". Erase voltages are produced by superimposing voltage pulses on a sustainer wave form in opposition to the sustainer voltage to develop a potential sufficient to cause a discharge in an "on state" cell and draw the charges from the dielectric surfaces such that the cell will be in the "off state". The wall voltage of a discharged cell is termed an "off state wall voltage" and frequently is midway between the extreme magnitude limits of the sustainer voltage.

Cells are transferred to the "on state" by applying a portion of the manipulating signal superimposed on the sustaining voltage, termed a "select signal", on each of two opposed electrode portions which are proximate the cell. Conventionally, like sustaining signals are imposed on each electrode array so that half the sustaining voltage is imposed on each array and half the select signal is imposed on the addressed cell electrode in each electrode array at a time when the sum of the applied voltages is sufficient to ignite a discharge. Further, the partial select signals on each electrode are limited to a value which will not impose a firing potential across other cells defined by that electrode and not selected. A typical write signal for a cell is developed by applying half select voltages to the addressed electrodes of the cell to be placed in the "on state" at a time the sustaining voltages are developing a pedestal potential somewhat below the maximum sustaining voltage. Typically, a write signal is imposed on each opposed electrode portion of the cell during the terminal portion of a sustain voltage half cycle when any wall charging which may result from the prior sustainer transient is substantially completed. The manipulating signal thus ignites a single, and unique, cell at the intersection of the selected two opposed electrodes. This ignited discharge thus establishes the cell in the "on state" since a quantity of charge is stored in the cell such that, on each succeeding half cycle of the sustaining voltage, a gaseous discharge will be produced.

In order to erase a cell or transfer it from the "on state" to the "off state", the erase signal is imposed as a firing voltage which extends from the sustainer voltage toward and through the neutral wall charge voltage level. As for writing, the erase manipulation is facilitated if the sustaining voltage is at a pedestal level below the level providing the maximum applied voltage so that the erase partial select voltages are at a convenient level. Typically, an erase signal is imposed on each opposed electrode portion of the cell during the terminal portion of a sustain voltage half cycle, when the wall charging from the prior sustainer discharge is substantially completed, but preceding the next half cycle alternation by enough time so that the wall discharge of the selected cell is substantially stabilized.

SUMMARY OF THE INVENTION

The present invention concerns a method and an apparatus for operating a gas discharge display/memory panel having a plurality of cells each defined by a proximate portion of at least one electrode in each of a pair of opposed, spaced electrode arrays. A sustainer voltage source imposes a pulsating voltage having a period and a maximum potential across each of the cells wherein the pulsating wave form is applied to the electrodes of one of the electrode arrays while the electrodes of the other array are maintained at the reference potential of the wave form, typically the system ground potential.

The sustainer potentials are applied to the electrodes through switching circuits individual to the electrodes, each circuit including a normally turned on MOSFET and a feed through diode. The MOSFET and the diode are oppositely poled and connected in parallel between the potential sources and the associated electrode. When a cell is addressed, either written or erased, the MOSFETs in the switching circuits connected to the one electrode array are turned off except for the MOSFET connected to the electrode of the selected cell. The MOSFET in the switching circuit for the other electrode array connected to the electrode of the selected cell is turned off while an address pulser for each electrode array is turned on to apply partial select address voltage pulses only to the electrodes of the selected cell.

The address pulser for the one electrode array is connected in parallel with the sustainer voltage source and therefore applies its partial select voltage pulse to an electrode through the associated switching circuit. The address pulser for the other electrode array is connected to each electrode through a capacitor individual to that electrode and the series connected pulser and capacitor are connected in parallel with the switching circuit associated with that electrode. Thus, the capacitor couples the partial select voltage pulse to the electrode when the MOSFET in the associated switching circuit is turned off.

A clamping circuit is also connected to the electrodes of the one electrode array through the switching circuits. The clamping circuit clamps the nonaddressed electrodes at a predetermined potential during the addressing to maintain the sustainer wave form. A keyer circuit can be connected to the electrodes of the other electrode array to apply a keyer pulse to the selected electrode for improved addressing of the cell.

Several advantages result from the use of the above described gas discharge panel operating system. The MOSFETs can be fabricated using a single technology such as D MOS and the feed through diodes could be formed on the same integrated circuit chip to reduce the number of different circuits required. The number of sustainer voltage circuits is reduced since one electrode array is maintained at the reference potential and the coupling capacitors can be formed as a conductive strip orthogonal to the associated electrode array over the dielectric material.

It is an object of the present invention to simplify the operating circuits for a gas discharge display memory device by eliminating the floating power supplies for generating the sustaining and addressing voltages.

It is another object of the present invention to reduce the number of sustainer voltage circuits required to operate a gas discharge panel by applying the sustainer wave form to one electrode array while maintaining the other electrode array at the reference potential of the sustainer voltage.

DESCRIPTION OF THE PREFERRED EMBODIMENT

Figure 1:
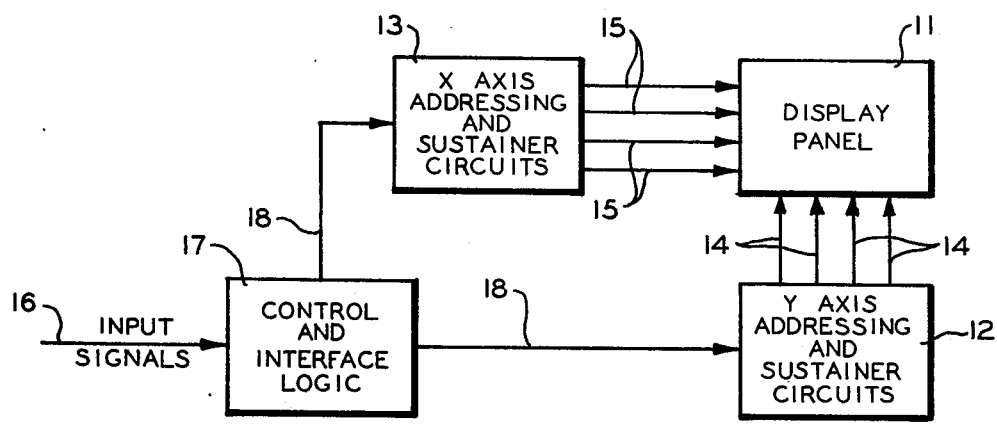
FIG. 1 is a block diagram of a multicelled gas discharge display/memory device and operating system therefor.

There is shown in FIG. 1 a block diagram of a multicelled gas discharge display/memory device and operating system therefor to which the present invention is applicable. The device is represented as a display panel 11 which may be of the type disclosed in U.S. Pat. No. 3,499,167 issued to Theodore C. Baker et al. The panel 11 includes a pair of opposed electrode arrays (not shown) with proximate electrode portions of at least one electrode in each array defining the cells. Sustainer and addressing voltage waveforms are applied to the panel 11 to maintain and manipulate the discharge states of individual cells. The addressing and sustainer wave forms are generated by a pair of addressing and sustainer circuits, a Y axis circuit 12 and an X axis circuit 13, which are connected to the Y axis and X axis electrode arrays respectively. A plurality of leads 14 are representative of the interconnections between the Y axis circuit 12 and the Y axis electrodes of the panel 11 and a plurality of leads 15 are representative of similar interconnections on the X axis. The information to be displayed by the panel 11 is externally generated and applied as input signals on one or more input lines 16 to a control/interface logic circuit 17. The circuit 17 buffers and decodes the input signals to generate control signals on lines 18 to the circuits 12 and 13.

Figure 2:
FIG. 2 is a wave form diagram of the sustainer wave form with "write" and "erase" pulses which are generated according to the present invention.
Figure 2:
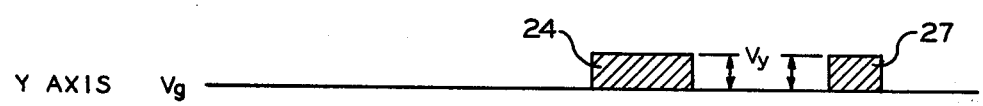
Figure 2:
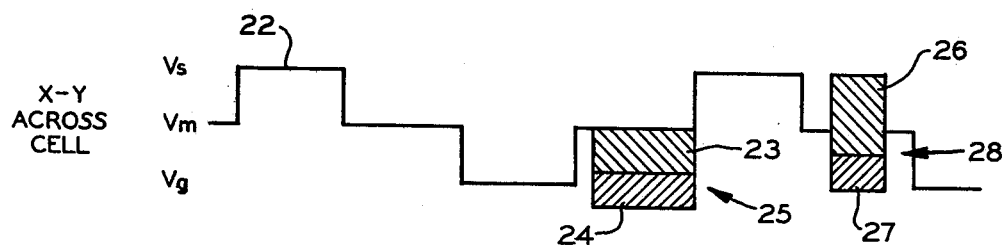

FIG. 2 shows the addressing and sustainer wave forms which are generated by the circuits 12 and 13 of FIG. 1 according to the present invention. During the operation of the panel 11, the X and Y sustainer circuits impress the sustainer voltages on the X and Y electrode arrays respectively. As shown in FIG. 2, an X axis sustainer wave form 21 is generated by cyclically applying a maximum sustainer potential Vs, an intermediate potential Vm, and a minimum potential Vg which can be the system ground potential. In accordance with the present invention, the Y axis sustainer circuits impress the potential Vg on the Y axis electrodes. Thus, a composite sustainer wave form 22 which appears across the panel cells will be identical to the wave form 21.

When a cell has been selected for either writing or erasing, the circuit 17 senses the timing of the sustainer wave form and generates the control signals necessary to either write or erase a selected cell. If a cell has been selected for writing, all X axis electrodes are clamped at the intermediate potential Vm. An X axis partial select write pulse 23 is generated by applying a potential Vw to the selected X axis electrode in opposition to the potential Vm and a Y axis partial select write pulse 24 is generated by applying a potential Vy to the selected Y axis electrode. The two partial select write pulses 23 and 24 combine, as shown in the composite wave form 22, to form a full select write pulse 25 which appears across the selected cell. When a cell has been selected for erasing, all of the X axis electrodes are clamped at the maximum potential Vs. An X axis partial select erase pulse 26 is generaged by applying a potential Ve to the selected X axis electrode and a Y axis partial select erase pulse 27 is generated by applying the potential Vy to the selected Y axis electrode. The two partial select erase pulses 26 and 27 combine to form a full select erase pulse 28 which appears across the selected cell.

Figure 3:
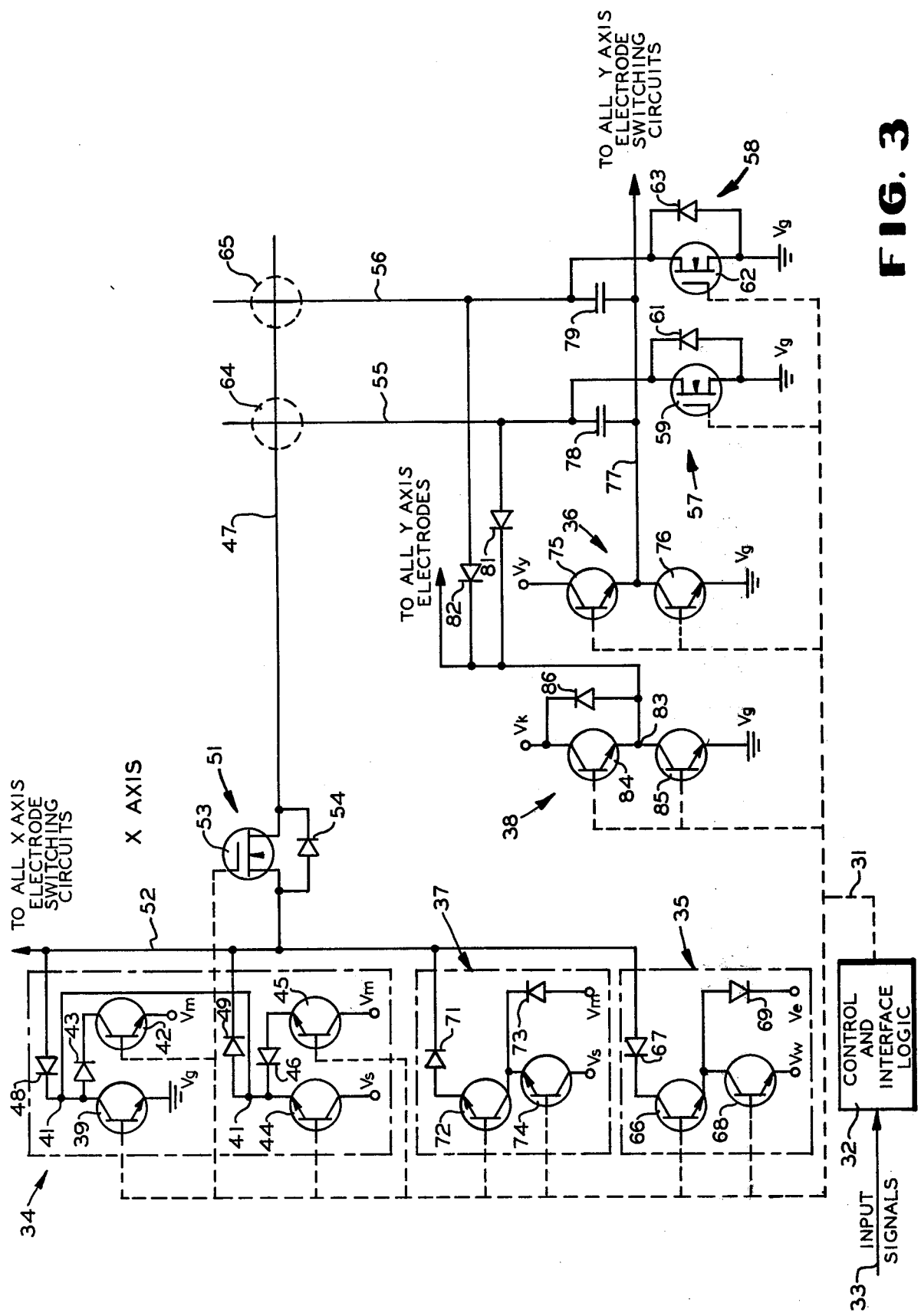
FIG. 3 is a partial schematic, partial block diagram of a portion of the addressing and sustainer circuits according to the present invention.

FIG. 3 is a partial schematic, partial block diagram of a portion of the addressing and sustainer circuits according to the present invention. A plurality of dotted lines 31 represent the control lines which are utilized to transmit control signals from a control and interface logic circuit 32 to the various circuit switching devices. The circuit 32 generates the control signals to the switching devices to generate the sustainer wave forms and address pulses of FIG. 2. The information to be displayed is externally generated and applied to the circuit 32 on an input line 33.

The sustainer wave form 21 of FIG. 2 is applied to the X axis electrodes by an X axis sustainer circuit 34. Partial select address pulses are applied to the selected X and Y electrodes by an X axis addressing circuit 35 and a Y axis addressing circuit 36 respectively. A clamping circuit 37 is also utilized when applying the partial select address pulses to the X axis electrodes. If it is desired to key the address pulses to obtain a steeper leading edge, a keyer pulser circuit 38 is used to key the partial select address pulses which are applied to the Y axis electrodes.

The X axis sustainer circuit 34 includes four switching circuits each of which is represented as a single NPN transistor. A pull-down minimum transistor 39 has a collector connected to a common junction 41, a base connected to the lines 31 to receive control signals from the circuit 32, and an emitter connected to a source (not shown) of the ground potential Vg. A pull-down medium transistor 42 has a collector connected to a cathode of a blocking diode 43, a base connected to receive the control signals, and an emitter connected to an intermediate power supply (not shown) to receive the potential. An anode of the diode 43 is connected to the common junction 41. A pull-up maximum transistor 44 has an emitter connected to the junction 41, a base connected to receive the control signals, and a collector connected to a maximum voltage power supply (not shown) to receive the potential Vs. A pull-up medium transistor 45 has an emitter connected to an anode of a blocking diode 46, a base connected to receive the control signals, and a collector connected to an intermediate power supply (not shown) to receive the potential Vm. A cathode of the diode 46 is connected to the junction 41.

The transistors of the circuit 34 are individually enabled by the control signals from the circuit 32 to generate the sustainer wave form 21 of FIG. 2. The sustainer voltage is applied to an X axis electrode 47 through a pair of diodes 48 and 49 and an electrode switching circuit 51. The diodes 48 and 49 are oppositely poled to provide a low impedance path for the sustainer current. The two diodes are connected between an address bus line 52 and the common junction 41. The diode 48 has an anode connected to the line 52 and a cathode connected to the junction 41. The diode 49 has a cathode connected to the line 52 and an anode connected to the junction 41.

The circuit 51 comprises a metal oxide semiconductor field effect transistor (MOSFET) 53 having a drain connected to the X axis electrode 47, a gate connected to the lines 31 to receive control signals from the circuit 32, and a source connected to the line 52. A feed through diode 54 has an anode connected to the source and a cathode connected to the drain of the MOSFET 53. The circuit 51 provides low impedance paths for both positive and negative sustainer currents. When the potential at junction 41 exceeds the potential on the electrode 47, the sustainer current flows through the diodes 49 and 54. However, when the potential on the electrode 47 exceeds the potential at the junction 41, the sustainer current will flow through the MOSFET 53 and the diode 48. The sustainer voltage is also applied to all other X axis electrodes through a plurality of X axis electrode switching circuits (not shown) similar to the circuit 51, each one of which is connected between the line 52 and a respective electrode.

The sequence of operation of the X axis sustainer circuits is as follows. Assuming that the transistor 45 is turned on to apply the Vm voltage through the diodes 46, 49 and 54 to the electrode 47 and to the other electrodes through the feed through diodes (not shown) connected to the line 52, the X axis sustainer wave form will be at Vm as shown in FIG. 2. Now the transistor 45 is turned off and the transistor 44 is turned on to apply the Vs potential through the diode 49 to the line 52 and then through the feed through diodes to the X axis electrodes. The next change is the sustainer wave form is to return to the Vm potential. However, since the cells have been charged to the Vs potential, the transistor 42 is turned on when the transistor 44 is turned off to allow the cells to discharge to the Vm potential through the normally turned on MOSFETs and the diodes 48 and 43. Next, the transistor 42 is turned off and the transistor 39 is turned on to further dischage the cells to the Vg potential. The cycle is begun again by turning off the transistor 39 and turning on the transistor 45 to charge the cells to the Vm potential.

The MOSFETs which are connected to the X axis electrodes are normally maintained in the on state except when it is desired to address a selected cell. At this time the MOSFETs connected to the non-selected X axis electrodes are turned off during the generation of an address pulse. The MOSFET connected to the X axis electrode which corresponds to the selected cell is maintained in the on state. Turning off the MOSFETs connected to the nonselected X axis electrodes prevent the partial select address voltage pulse from appearing on these nonselected electrodes.

During normal sustainer operation, a ground potential Vg is applied to a pair of Y axis electrodes 55 and 56 through a pair of Y axis electrode switching circuits 57 and 58 respectively. The circuit 57 comprises a MOSFET 59 having a drain connected to the electrode 55, a gate connected to receive control signals, and a source connected to the ground potential Vg. A feed through diode 61 has a cathode connected to the drain and an anode connected to the source of the MOSFET 59. The circuit 58 comprises a MOSFET 62 and a feed through diode 63 connected in a manner similar to the connections of the circuit 57. The ground potential Vg is applied to all of the other Y axis electrodes (not shown) through a plurality of Y axis electrode switching circuits (not shown) each one of which is connected between the ground potential Vg and a respective electrode.

The MOSFETs of the Y axis electrode switching circuits are normally maintained in the on state. However, when it is desired to address a selected cell, the MOSFET connected to the Y axis electrode which has been selected for addressing is turned off during the generation of an address pulse. Turning off the MOSFET connected to the selected Y axis electrode prevents the address pulse from returning to ground and forces it to appear at the selected electrode.

A MOSFET is a field effect transistor whose gate is a metal film deposited on an oxide layer to insulate the gate from the source and the drain. The particular type of MOSFETs which are shown in FIG. 3 are depletion type MOSFETs having substrates which are internally connected to the source and are only representative of the several types of MOSFETs which will result in successful operation of the display panel. One advantage to using MOSFETs is that they are easily fabricated on integrated circuits and in some cases require only a single technology for fabrication. It should also be noted that if the feed through diodes represented in FIG. 3 are integrated with the chip, only one connection per electrode is made to the integrated circuit.

The intersection of the X axis electrodes and the Y axis electrodes define a plurality of cells or discharge sites at which the composite sustainer wave form 22 of FIG. 2 appears. As shown in FIG. 3, the X axis electrode 47 intersects the Y axis electrodes 55 and 56 to define a pair of cells 64 and 65, each of which is represented by a dashed circle.

The X axis addressing circuit 35 generates either a partial select write or a partial select erase pulse to the selected X electrodes. The partial select address pulses are applied to the selected electrodes through an address switch which is represented as an NPN transistor 66 having a collector connected to the cathode of a diode 67, a base connected to receive the control signals, and an emitter connected to both a write pulser and an erase pulser. An anode of the diode 67 is connected to the line 52. The write pulser is represented as an NPN transistor 68 having a collector connected to the emitter of the transistor 66, a base connected to receive control signals, and an emitter connected to a write power supply (not shown) which generates the potential Vw. An erase pulser is represented as a clamping diode 69 having an anode connected to the emitter of the transistor 66 and a cathode connected to an erase power supply (not shown) which generates the potential Ve. Both of the Vw and the Ve power supplies may be referenced to the same ground potential as the sustainer power supply. When an X electrode is selected for addressing, a partial select write pulse is generated by turning on the transistors 66 and 68. A partial select erase pulse is generated by turning on the transistor 66 and maintaining the transistor 68 in an off state.

A clamping circuit 37 is utilized during the generation of both the write and the erase pulses. The circuit 37 comprises a blocking diode 71, a clamp switch, a write clamp, and an erase clamp. The blocking diode 71 has a cathode connected to the line 52 and an anode connected to the clamp switch. The clamp switch is represented as an NPN transistor 72 having an emitter connected to the anode of the diode 71, a base connected to receive the control signals, and a collector connected to both the write and the erase clamps. The write clamp is represented as a diode 73 having a cathode connected to the collector of the transistor 72 and an anode connected to the intermediate power supply (not shown) to receive the potential Vm. The erase clamp is represented as an NPN transistor 74 having an emitter connected to the collector of the transistor 72, a base connected to receive the control signals, and a collector connected to the maximum potential power supply (not shown) to receive the potential Vs.

During the period of time when the cells are not being written nor erased, both of the transistors 72 and 74 are maintained in an off state. If one or more cells are selected for writing, the circuit 32 generates control signals which turn on the transistor 72 and maintain the transistor 74 in an off state. Hence, the X axis electrodes which do not correspond to selected cells are clamped at the intermediate potential Vm during the generation of a write pulse. If one or more cells are selected for erasing, the circuit 32 generates control signals which turn on both of the transistors 72 and 74. Hence, the nonselected X axis electrodes are clamped at the maximum potential Vs during the generation of an erase pulse.

The Y axis addressing circuit 36 generates both the write and erase partial select voltage pulses at the selected Y electrodes. The circuit 36 is represented as a pair of NPN transistors 75 and 76 whose bases are connected to receive control signals from the circuit 32. The transistor 75 has a collector connected to an address power supply (not shown) to receive an address potential Vy and an emitter connected to a capacitor bus line 77. The transistor 76 has a collector connected to the line 77 and an emitter connected to the ground potential power supply (not shown) to receive the potential Vg. The line 77 is connected to the Y axis electrodes 55 and 56 by capacitors 78 and 79 respectively. The line 77 is also connected to all other Y axis electrodes (not shown) by a plurality of capacitors (also not shown) similar to the capacitors 78 and 79. The capacitor bus can be fabricated by applying a conductive strip orthoganal to the Y axis electrodes over the dielectric which insulates the Y axis electrodes from the gas.

During the time period when there are no cells selected for addressing, the circuit 32 generates control signals which maintain the transistors 75 and 76 in an off and on state respectively to apply the ground potential Vg to the line 77. However, when a cell has been selected for addressing, the transistors 75 and 76 are turned on and off respectively to generate a partial select address pulse Vy. Hence, the potential Vy of the address pulse which is applied to the line 77 will be coupled through the capacitors to appear at the selected Y axis electrodes.

If it is desired to key the address pulses which are applied to the Y axis electrodes, a keyer pulser circuit 38 can be utilized. The circuit 38 is connected to the Y axis electrodes 55 and 56 by a pair of diodes 81 and 82 respectively each one of which has a cathode connected to a common junction 83 and an anode connected to a respective electrode. The circuit 38 is connected to all other Y axis electrodes by a plurality of diodes each one of which is connected between a respective electrode and the junction 83.

The keyer pulser circuit 38 includes a pair of NPN transistors 84 and 85 and a clamping diode 86. The transistor 84 has a collector connected to a keyer power supply (not shown) to receive a keyer potential Vk, a base connected to receive the control signals, and an emitter connected to the junction 83. The diode 86 has an anode connected to the junction 83 and a cathode connected to the Vk power supply to function as a clamp. The transistor 85 has a collector connected to the junction 83, a base connected to receive the control signals, and an emitter connected to receive the ground potential Vg. The transistors 84 and 85 are maintained in an off and on state respectively except when it is desired to address a cell. At this time the Y axis partial select address pulse can be keyed if the transistors 84 and 85 are turned on and off respectively during the generation of the half select address pulse.

In summary, the present invention concerns an operating system for a multicelled gas discharge display/memory device, the device including a pair of opposed, spaced electrode arrays with proximate electrode portions of at least one electrode in each array defining the cells. The operating system includes a sustainer voltage source for imposing a pulsating potential voltage having a period and a predetermined maximum magnitude across each of the cells. The sustainer voltage can be generated at the maximum potential during a first portion of a period, at a first predetermined potential intermediate the maximum potential and a reference potential during a second portion of the period, at the reference potential during a third portion of the period and at a second intermediate potential during a fourth portion of the period. The reference potential can be the system ground potential and the first and second intermediate potentials can be equal.

The operating system also includes address pulser means for generating write and erase address pulses to manipulate the discharge state of individual cells between an "on state" and an "off state" and switching circuits individual to each of the electrodes for selectively applying the sustainer voltage and the address pulses to the electrodes. The switching circuits associated with one of the electrode arrays are connected between the sustainer voltage source and the electrodes of the one electrode array. The switching circuits associated with the other one of the electrode arrays are connected between a source of the reference potential and the electrodes of the other electrode array. A control means is connected to the switching circuits for turning all of them on whereby the sustainer voltage is imposed across the cells. The switching circuits can each include a MOSFET and a diode oppositely poled and connected in parallel.

The address pulser means includes a first pulser means connected in parallel with the sustainer voltage source for generating a partial select address pulse and a second pulser means connected in parallel with the switching circuits associated with the other electrode array for generating a partial select address pulse. The control means is connected to the address pulser means and during addressing turns off all of the switching circuits associated with the one electrode array except the switching circuit connected to the electrode of the cell selected for addressing, turns off the switching circuit connected to the electrode of the selected cell in the other electrode array and turns on the first and second pulser means whereby the partial select address pulses are generated to impose one of the address pulses across the selected cell.

The system includes clamping means connected in parallel with the sustainer voltage source for clamping the unaddressed electrodes of the one electrode array at the maximum potential during the generation of the erase pulse and at the intermediate potential during the generation of the write pulse, the erase pulse being generated during the second portion of a period and the write pulse being generated during the fourth portion of a period. The system can also include capacitor means connected between the second pulser means and the electrodes of the other electrode array. The capacitor means can be formed by a conductive strip positioned orthogonally with respect to and spaced from the electrodes of the other electrode array by a dielectric material. A keyer pulser means can be connected to the other electrode array for applying a keyer pulse to the electrode of the selected cell to improve the addressing.

The present invention also concerns the method of manipulating the discharge state of the individual cells. Included in the method are the steps of applying the periodic pulsating potential sustainer voltage to one of the electrode arrays and applying the reference or ground potential to the other electrode array; turning a cell in the "off state" to the "on state" by clamping the one electrode array at the potential of the sustainer voltage, applying a partial select write voltage pulse to the electrode of the one electrode array associated with the cell and applying a partial select address voltage to the electrode of the other electrode array associated with the cell; and turning a cell in the "on state" to the "off state" by clamping the one electrode array at the potential of the sustainer voltage, applying a partial select erase voltage pulse to the electrode of the one electrode array associated with the cell and applying a partial select address voltage pulse to the electrode of the other array associated with the cell.

The step of turning a cell to the "on state" can be performed during the fourth portion of a sustainer voltage period by clamping the one electrode array at the intermediate potential and applying the write pulse in opposition to the intermediate potential sustainer voltage. The step of turning a cell to the "off state" can be performed during the second portion of a period by clamping the one electrode array at the maximum potential and applying the erase voltage pulse in opposition to the maximum potential sustainer voltage.

In accordance with the provisions of the patent statutes, the principle and mode of operation of the invention have been explained and illustrated in its preferred embodiment. However, it must be understood that the invention may be practiced otherwise than as specifically illustrated and described without departing from its spirit or scope.

What is claimed is:

1. In an operating system for a multicelled gas discharge display/memory device, the device including a pair of opposed, spaced electrode arrays with proximate electrode portions of at least one electrode in each array defining the cells and the operating system including a sustainer voltage source for imposing a pulsating potential voltage having a period and a predetermined maximum potential across each of the cells, address pulser means for generating write and erase address pulses to manipulate the discharge state of individual cells between an "on state" and an "off state" and switching circuits individual to each of the electrodes for selectively applying the sustainer voltage and the address pulses to the electrodes, the improvement comprising:

the sustainer voltage source generating the sustainer voltage with reference to a predetermined potential;

the switching circuits associated with one of the electrode arrays connected between the sustainer voltage source and the electrodes of said one electrode array;

the switching circuits associated with the other one of the electrode arrays connected between a source of the predetermined reference potential and the electrodes of said other electrode array;

the address pulser means including first pulser means connected in parallel with the sustainer voltage source for generating a partial select address pulse and second pulser means connected in parallel with the switching circuits associated with said other electrode array for generating a partial select address pulse; and control means connected to the switching circuits and the address pulser means for turning on all of the switching circuits whereby the sustainer voltage is imposed across the cells and for turning off all of the switching circuits associated with said one electrode array except the switching circuit connected to the electrode of the cell selected for addressing, turning off the switching circuit connected to the electrode of said selected cell in said other electrode array, and turning on said first and second pulser means whereby said partial select address pulses are generated to impose one of the address pulses across said selected cell.

2. A system according to claim 1 wherein said predetermined reference potential is the system ground potential.

3. A system according to claim 1 wherein the sustainer voltage source generates the sustainer voltage at the maximum potential during a first portion of a period of the voltage, at a first predetermined potential intermediate the maximum and reference potentials during a second portion of the period, at the predetermined reference potential during a third portion of the period and at a second predetermined potential intermediate the maximum and reference potentials during a fourth portion of the period and wherein said first and second pulser means generate an erase address pulse during said second portion of any selected sustainer voltage period and generate a write pulse during said fourth portion of any selected sustainer voltage period.

4. A system according to claim 3 wherein said first and second predetermined intermediate potentials are equal.

5. A system according to claim 3 including clamping means connected in parallel with the sustainer voltage source for clamping the nonaddressed electrodes of said one electrode array at said first predetermined intermediate potential during the generation of said erase pulse and at the maximum potential during the generation of said write pulse.

6. A system according to claim 1 including capacitor means connected between said second pulser means and the electrodes of said other electrode array.

7. A system according to claim 6 wherein said capacitor means is formed by a conductive strip positioned orthogonally with respect to and spaced from the electrodes of said other electrode array by a dielectric material.

8. A system according to claim 1 wherein said switching circuits each include a MOSFET and a diode oppositely poled and connected in parallel.

9. A system according to claim 1 including keyer pulser means connected in parallel with said second pulser means for applying a keyer pulse to the electrode of said selected cell in said other electrode array.

10. A method of manipulating the discharge state of individual cells of a gas discharge display/memory device, the device including a pair of opposed electrode arrays with proximate electrode portions of at least one electrode in each array defining the cells, means for generating a periodic pulsating potential sustainer voltage having a magnitude and duration sufficient to maintain a discharge in any cell which is in the "on state", the maximum magnitude of said sustainer voltage being referenced from a predetermined ground potential, and clamping means for generating a clamping voltage, comprising the steps of:

applying said sustainer voltage to one of the electrode arrays and applying said predetermined ground potential to the other one of the electrode arrays;

turning a cell in the "off state" to the "on state" by applying said clamping voltage to said one electrode array at the potential of said sustainer voltage, applying a partial select write voltage pulse to the electrode of said one electrode array associated with said cell and applying a partial select address voltage pulse to the electrode of said other electrode array associated with said cell; and turning a cell in the "on state" to the "off state" by applying said clamping voltage to said one electrode array at the maximum potential of said sustainer voltage, applying a partial select erase voltage pulse to the electrode of said one electrode array associated with said cell and applying a partial select address voltage pulse to the electrode of said other electrode array associated with said cell.

11. A method according to claim 10 wherein said sustainer voltage is generated at said maximum potential during a first portion of a period of said sustainer voltage, is generated at a predetermined potential intermediate said maximum potential and said ground potential during a second portion of said period, is generated at said ground potential during a third portion of said period and is generated at said intermediate potential during a fourth portion of said period.

12. A method according to claim 11 wherein said step of turning a cell to the "on state" is performed during said fourth portion of one of said periods by clamping said one electrode array at said intermediate potential and applying said write voltage pulse in opposition to said intermediate potential sustainer voltage.

13. A method according to claim 11 wherein said step of turning a cell to the "off state" is performed during said second portion of one of said periods by clamping said one electrode array at said maximum potential and applying said erase voltage pulse in opposition to said maximum potential sustainer voltage.

* * * * *